United States Patent
Lee et al.

(10) Patent No.: US 12,518,996 B2
(45) Date of Patent: Jan. 6, 2026

(54) TOWER LIFT, LOGISTICS SYSTEM INCLUDING THE SAME, AND TRANSFER METHOD USING THE SAME

(71) Applicant: SEMES CO., LTD., Cheonan-si (KR)

(72) Inventors: Na Hyun Lee, Ansan-si (KR); Sang-Oh Kim, Seoul (KR); Myung Jin Lee, Hwaseong-si (KR); Hee Jae Byun, Yongin-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 496 days.

(21) Appl. No.: 17/886,823

(22) Filed: Aug. 12, 2022

(65) Prior Publication Data

US 2023/0076551 A1    Mar. 9, 2023

(30) Foreign Application Priority Data

Sep. 3, 2021 (KR) .......... 10-2021-0117728

(51) Int. Cl.
*H01L 21/677* (2006.01)
*B66B 11/02* (2006.01)

(52) U.S. Cl.
CPC ........ *H01L 21/6773* (2013.01); *B66B 11/022* (2013.01); *B65G 2201/0297* (2013.01); *Y10S 414/14* (2013.01)

(58) Field of Classification Search
CPC .......... B65G 2201/0297; B66B 11/022; H01L 21/6773; Y10S 414/14; Y10S 187/902
USPC .......................................... 187/249; 414/940
See application file for complete search history.

(56) References Cited

U.S. PATENT DOCUMENTS

| | | | |
|---|---|---|---|
| 1,914,128 A * | 6/1933 | James | B66B 9/00 187/249 |
| 10,329,122 B1 * | 6/2019 | Schmidt | B66B 9/00 |
| 11,970,363 B2 * | 4/2024 | Weibel | B66B 11/022 |

FOREIGN PATENT DOCUMENTS

| | | | |
|---|---|---|---|
| CN | 1276336 A | 12/2000 | |
| CN | 108002286 A | 5/2018 | |
| EP | 1074503 A2 * | 2/2001 | ............... B66B 1/42 |
| JP | H04-167538 A | 6/1992 | |
| JP | 04223985 A * | 8/1992 | ......... Y10S 187/902 |
| KR | 101278021 B1 | 6/2013 | |
| KR | 10-2018-0047089 A | 5/2018 | |
| KR | 101885434 B1 | 9/2018 | |
| WO | WO-2004087552 A1 * | 10/2004 | ............... B66B 1/42 |
| WO | WO-2013118167 A1 * | 8/2013 | ........... B66B 11/022 |
| WO | WO-2017085774 A1 | 5/2017 | |

OTHER PUBLICATIONS

Chinese Office Action dated May 24, 2025 for corresponding Chinese Application No. 202211045590.0.

* cited by examiner

*Primary Examiner* — James Keenan
(74) *Attorney, Agent, or Firm* — Harness, Dickey & Pierce, P.L.C.

(57) ABSTRACT

Provided is a tower lift, including: a body; a first carriage module and a second carriage module configured to be movable in a vertical direction along the body and each support objects to be transferred; a driving unit comprising a driving belt which vertically moves the first carriage module and the second carriage module and on which the first carriage module or the second carriage module is mounted; and a gap adjusting unit adjusting a gap between the first carriage module and the second carriage module.

8 Claims, 12 Drawing Sheets

FIG. 1

(Background Art)

TOWER LIFT, LOGISTICS SYSTEM INCLUDING THE SAME, AND TRANSFER METHOD USING THE SAME

CROSS-REFERENCE TO RELATED APPLICATIONS

This application claims priority to and the benefit of Korean Patent Application No. 10-2021-0117728 filed in the Korean Intellectual Property Office on Sep. 3, 2021, the entire contents of which are incorporated herein by reference.

TECHNICAL FIELD

The present invention relates to a tower lift, a logistics system including the same, and a transfer method using the same. More particularly, the present invention relates to a tower lift for transferring an object to be transferred in a vertical direction by using a carriage module, a logistics system including the same, and a transfer method using the same.

BACKGROUND ART

In general, a manufacturing line in a semiconductor or display manufacturing plant consists of multiple floors, and equipment for performing processes, such as deposition, exposure, etching, ion implantation, and cleaning, may be disposed on each floor, and a semiconductor device or a display device may be manufactured by repeatedly performing a series of unit processes on a semiconductor wafer used as a semiconductor substrate or a glass substrate used as a display substrate.

Meanwhile, the transfer of material between the respective floors, that is, the transfer of materials, such as semiconductor wafers or glass substrates, may be performed by a tower lift installed in a vertical direction through the respective floors.

Figure 1:
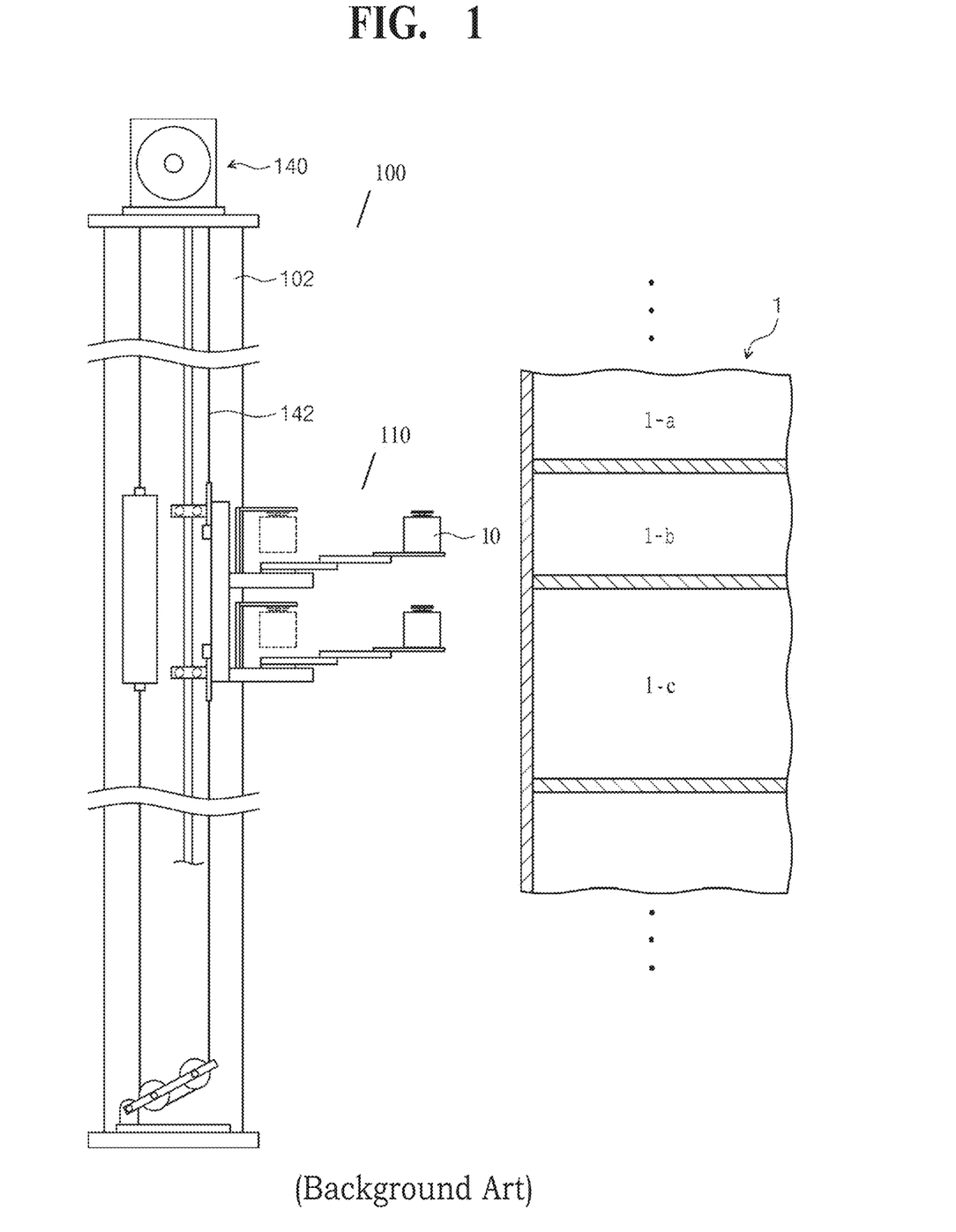
FIG. 1 is a diagram schematically illustrating a general tower lift.

FIG. 1 is a diagram illustrating a configuration of a general tower lift 100 for transferring materials to a tower 1 equipped with a manufacturing line for treating a substrate.

Referring to FIG. 1, the tower lift 100 includes a main frame 102, a carriage module 110, a driving module, and the like. The main frame 102 extends in a vertical direction. The carriage module 110 is disposed in front of the main frame 102 and is configured to be movable in the vertical direction along the main frame 102. The carriage module 110 is loaded with the material therein and transfers the material to a position corresponding to each floor 1-a, 1-b, and 1-c of the tower 1 equipped with a manufacturing line for treating the substrate. For example, the carriage module 110 may be loaded with a container 10 for storing the substrate. In one example, the carriage module 110 is loaded with two containers 10 in the vertical direction. The carriage module 110 is connected to a driving belt 142, and the driving module 140 causes the driving belt 142 to move the carriage module 110. For example, the driving module 140 may include a driving pulley in which the carriage module 110 is coupled to the driving belt 142, a driving unit for rotating the driving pulley, and the like.

However, as each carriage module 110 uniformly moves on the same driving belt 142, the position of any one container 10 constrains the position of any other container 10. Accordingly, there is a problem in that the amount of substrates transferred is limited and it takes a long time to transfer a large amount of substrates.

In addition, even if the number of carriage modules 110 is increased, each carriage module 110 is fixed to the same driving belt 142, and thus the gap between the respective carriage modules 110 is also fixed. Accordingly, when the height of each floor 1-a, 1-b, and 1-c is provided differently, there is a problem in that it is impossible to simultaneously transfer the container 10 to the plurality of floors 1-a, 1-b, and 1-c.

SUMMARY OF THE INVENTION

The present invention has been made in an effort to provide a tower lift capable of increasing the amount of substrates transferred.

The problem to be solved by the present invention is not limited to the above-mentioned problems. The problems not mentioned will be clearly understood by those skilled in the art from the descriptions below.

An exemplary embodiment of the present invention provides a tower lift including: a body; a first carriage module and a second carriage module configured to be movable in a vertical direction along the body and each support objects to be transferred; a driving unit comprising a driving belt which vertically moves the first carriage module and the second carriage module and on which the first carriage module or the second carriage module is mounted; and a gap adjusting unit adjusting a gap between the first carriage module and the second carriage module.

In the exemplary embodiment, the gap adjusting unit may include: a base plate mounted on the driving belt; and a driving member relatively moving one of the first carriage module and the second carriage module with respect to the other on the base plate.

In the exemplary embodiment, the gap adjusting unit may further include a driving rail which is provided on the base plate and on which the first carriage module and the second carriage module are mounted, and the driving member may include: a first driving device for moving the first carriage module on the driving rail; and a second driving device for moving the second carriage module on the driving rail.

In the exemplary embodiment, one of the first carriage module or the second carriage module may be fixed to the driving belt, and the gap adjusting unit may include: a pentagraph structure connected to the first carriage module and the second carriage module; and an actuator mounted on the first carriage module or the second carriage module to extend or contract the pentagraph structure.

In the exemplary embodiment, the first carriage module may be fixed to the driving belt, the first carriage module may be located above the second carriage module, and the gap adjusting unit may include: a sub belt connected to the first carriage module and the second carriage module; a sub pulley fixed to the first carriage module and coupled to the sub belt; and a rotating part for rotating the sub pulley.

In the exemplary embodiment, the driving module may further include: a main pulley provided above the body and coupled to the driving belt; and a rotating device for rotating the main pulley.

In the exemplary embodiment, the tower lift may further include a guide rail for guiding a vertical movement of the first carriage module and the second carriage module, and the first carriage module and the second carriage module may be provided with a guide wheel that is in contact with the guide rail.

In the exemplary embodiment, the object to be transferred may be a container in which a substrate is accommodated.

Another exemplary embodiment of the present invention provides a logistics system including a tower lift for transferring a container in which a substrate is stored to one or more destinations, in which the tower lift includes: a body; a first carriage module and a second carriage module configured to be movable in a vertical direction along the body by a driving belt; and a gap adjusting unit for adjusting a gap between the first carriage module and the second carriage module, and the gap between the first carriage module and the second carriage module is provided to be changeable by the gap adjusting unit, and the gap between one or more destination is different.

In the exemplary embodiment, the gap adjusting unit may include: a base plate mounted on the driving belt; and a driving member relatively moving one of the first carriage module and the second carriage module with respect to the other on the base plate.

In the exemplary embodiment, one of the first carriage module or the second carriage module may be fixed to the driving belt, and the gap adjusting unit may include: a pentagraph structure connected to the first carriage module and the second carriage module; and an actuator mounted on the first carriage module or the second carriage module to extend or contract the pentagraph structure.

In the exemplary embodiment, the first carriage module may be fixed to the driving belt, the first carriage module may be located above the second carriage module, and the gap adjusting unit may include: a sub belt connected to the first carriage module and the second carriage module; a sub pulley fixed to the first carriage module and coupled to the sub belt; and a rotating part for rotating the sub pulley.

In the exemplary embodiment, the logistics system may further include: a main pulley provided above the body and coupled to the driving belt; and a rotating device for rotating the main pulley.

In the exemplary embodiment, the tower lift may further include a guide rail for guiding a vertical movement of the first carriage module and the second carriage module, and the first carriage module and the second carriage module may be provided with a guide wheel that is in contact with the guide rail.

In the exemplary embodiment, the first carriage module and the second carriage module each further include: a support for supporting a container for storing the substrate therein; and a moving device for extending the support in a direction in which the destination is provided or contracting the support in an opposite direction.

Still another exemplary embodiment of the present invention provides a transfer method including: in the case where objects to be transferred are simultaneously transferred to adjacent destinations where a distance between the destinations is a first distance, raising a first carriage module and a second carriage module by a driving unit in a state in which a distance between the first carriage module and the second carriage module each supporting the object to be transferred is adjusted to the first distance; and in the case where objects to be transferred are simultaneously transferred to adjacent destinations where a distance between the destinations is a second distance, raising a first carriage module and a second carriage module by the driving unit in a state in which a distance between the first carriage module and the second carriage module is adjusted to the second distance, in which the first distance and the second distance are different from each other.

In the exemplary embodiment, the object to be transferred may be a container in which a substrate is accommodated, and each of the destinations may be provided with a stocker for storing an apparatus for treating a substrate or a container for accommodating the substrate.

In the exemplary embodiment, the driving unit may include: a driving belt which vertically moves the first carriage module and the second carriage module and on which the first carriage module or the second carriage module is mounted; and a main pulley coupled to the driving belt; and a rotating device for rotating the main pulley.

In the exemplary embodiment, the first carriage module and the second carriage module may be installed on a base plate, and as the base plate is raised and lowered by the driving belt, the first carriage module and the second carriage module may be simultaneously raised by the driving unit, and a gap between the first carriage module and the second carriage module may be adjusted on the base plate.

In the exemplary embodiment, the first carriage module may be directly raised and lowered by the driving belt, the second carriage module may be coupled to the first carriage module so as to be raised and lowered together with the first carriage module, and the second carriage module may be coupled to the first carriage module so as to be able to adjust the gap with respect to the first carriage module.

In the exemplary embodiment, the second carriage module may be connected to the first carriage module by a sub-belt, and the sub-belt may be provided to separately operate from the driving unit by a sub-pulley fixed to the first carriage module and coupled to the sub belt and a rotating part for rotating the sub pulley.

In the exemplary embodiment, the second carriage module may be connected to the first carriage module by a pentagraph structure, and the second carriage module may be raised and lowered with respect to the first carriage module by an actuator that extends or contracts the pentagraph structure.

According to the exemplary embodiment of the present invention, there is an advantage in that it is possible to increase the amount of substrates transferred in the tower lift.

The effect of the present invention is not limited to the foregoing effects. Those skilled in the art may clearly understand non-mentioned effects from the present specification and the accompanying drawings.

DETAILED DESCRIPTION

Advantages and characteristics, and a method for achieving them will be clear when exemplary embodiments described in detail with reference to the accompanying drawings are referred to. However, the present disclosure is not limited to exemplary embodiments disclosed herein but will be implemented in various forms, and the exemplary embodiments are provided so that the present disclosure is completely disclosed, and a person of ordinary skilled in the art can fully understand the scope of the present disclosure, and the present disclosure will be defined only by the scope of the appended claims.

Even if not defined, all terms (including technical or scientific terms) used herein have the same meaning as commonly accepted by common skill in the related art to which this invention belongs. Terms defined by the general dictionaries may be interpreted as having the same meaning as in the related art and/or in the text of the present application, and the terms will not be conceptualized or interpreted overly formal even if the term is not a clearly defined expression here. The terms used in the present specification is for the purpose of describing exemplary embodiments, and do not intend to limit the present invention.

In the present specification, a singular form includes a plural form as well, unless otherwise mentioned. A term "include" and/or various conjugations of this verb do not exclude the existence or an addition of one or more other compositions, components, constituent elements, steps, operations, and/or devices, in addition to the mentioned composition, component, constituent element, step, operation, and/or device. Further, "is provided" and "have" and the like should be interpreted in the same way.

Figure 2:
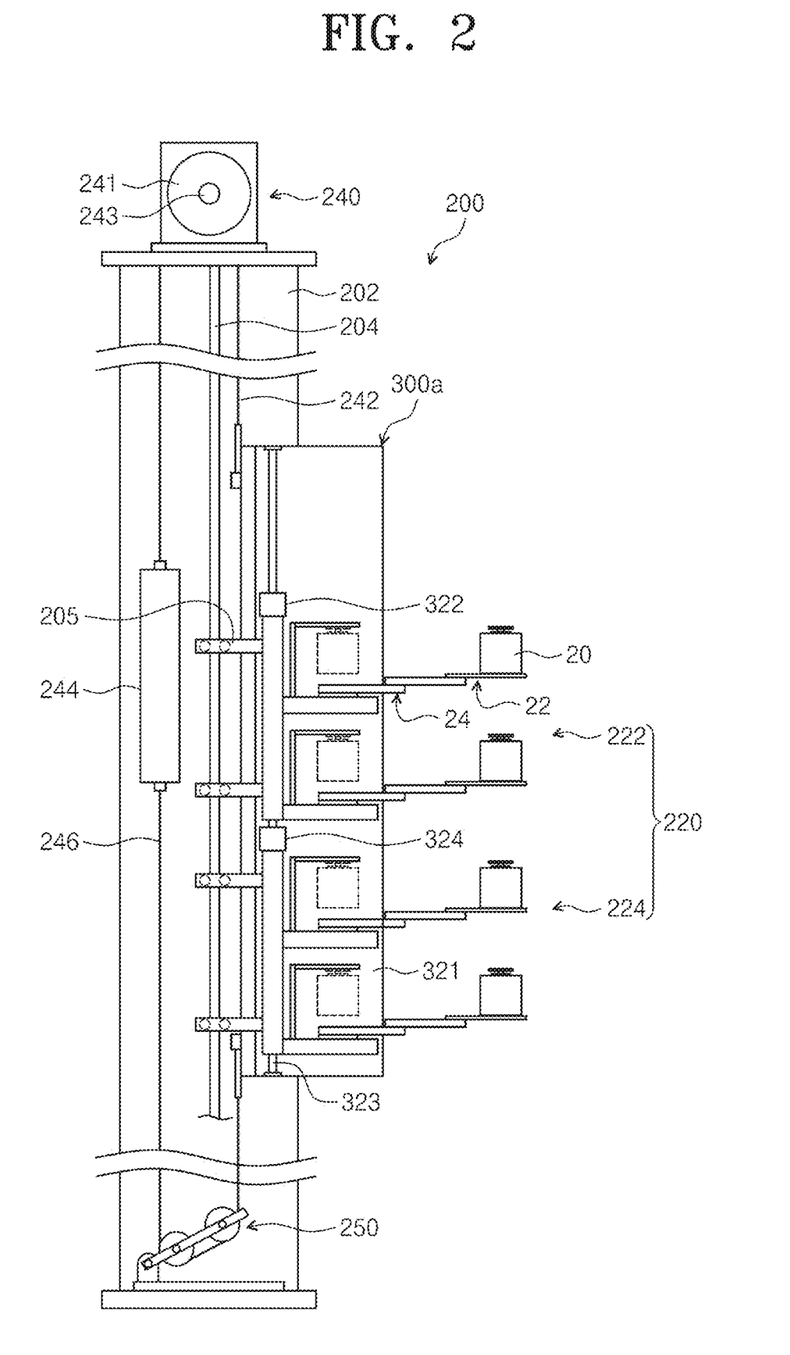
FIG. 2 is a diagram schematically illustrating a tower lift according to an exemplary embodiment of the present invention.

FIG. 2 is a diagram schematically illustrating a tower lift according to an exemplary embodiment of the present invention. The tower lift 200 according to the embodiment of the present invention may be used to transfer objects in a vertical direction. For example, the tower lift 200 may be used to transfer materials to each floor in a multi-floored manufacturing plant in which semiconductor or display manufacturing equipment is disposed.

Referring to FIG. 2, the tower lift 200 includes a body 202, a carriage module 220, a driving unit 240, a guide rail 204, and a gap adjusting unit 300.

The body 202 extends in the vertical direction. The carriage module 220 is provided to be movable in the vertical direction along the body 202. In one example, the carriage module 220 is placed in front of the body 202. In one example, a plurality of carriage modules 220 are provided. For example, the carriage module 220 includes a first carriage module 222 and a second carriage module 224. Alternatively, a larger number of carriage modules 220 may be provided.

The carriage module 220 includes a guide wheel 205, a support 22, and a moving device 24. The guide wheel 205 is mounted on a guide rail 204 which is to be described later, to allow the carriage module 220 to move in parallel with the body 202. An object to be transferred is mounted on the support 22. In one example, the object to be transferred is a container 20 in which a material, such as a semiconductor wafer, a glass substrate, or a reticle, is accommodated. In one example, the container 20 may be a Front Opening Unified Pod (FOUP). Optionally, the container 20 may be a POD. Also, the container 20 may be a magazine for accommodating a plurality of printed circuit boards, a tray for accommodating a plurality of semiconductor packages, and the like. The moving device 24 is provided as a robot capable of extending or contracting the support 22. The carriage module 220 may also have a robot that grips the container 20. The carriage module 20 may be transformed into various structures capable of moving the container 20.

The driving unit 240 moves the carriage module 220 in the vertical direction. In one example, the driving unit 240 includes a driving belt 242, a main pulley 241, and a rotating device 243.

The driving belt 242 allows the carriage module 220 to move along the body 202. Any one of the first carriage module 222 and the second carriage module 224 is mounted directly or indirectly on the driving belt 242 to move integrally with the driving belt 242. The main pulley 241 and the rotating device 243 allow the driving belt 242 to move the carriage module 220 in the vertical direction. The driving belt 242 is mounted on the main pulley 241. In one example, the driving belt 242 is provided as a timing belt. The rotating device 243 rotates the main pulley 241. The driving belt 242 is rotated by the rotation of the main pulley 241, and accordingly, the carriage module 220 is moved in the vertical direction.

The guide rail 204 allows the carriage module 220 to move while following the body 202 in a direction parallel to the body 202. The guide rail 204 extends parallel to the body 202 in the vertical direction along the body 202. The carriage module 220 may be provided with the guide wheel 205. The guide wheel 205 is mounted on the guide rail 204 and guides the carriage module 220 in the vertical direction along the guide rails 204. For example, the carriage module 220 may be mounted with two guide wheels 205 coupled to the guide rails 204 to twopoint support the carriage module 220.

In the example, the driving unit 240 may further include a brake module 250 and a weight module 244. The brake module 250 is provided to prevent the carriage module 220 from falling when the driving belt 242 is broken. In one example, the brake module 250 may be configured to prevent the carriage module 220 from falling by using friction force between the body 202 and a disk by using the disk or the like. The weight module 244 applies weight to the driving belt 242 to promote stable transference of the carriage module 220. For example, the carriage module 220 may be connected to one end of the driving belt 242, and the weight module 244 may be connected to the other end of the driving belt 242. A balance belt 246 connected to the brake module 250 may be connected to the carriage module 220 and the weight module 244.

The gap adjusting unit 300 adjusts a gap between the first carriage module 222 and the second carriage module 224. Hereinafter, the present invention will be described based on the case where the carriage module 220 includes the first carriage module 222 and the second carriage module 224, and the gap adjusting unit 300 adjusts the gap between the first carriage module 222 and the second carriage module 224. However, alternatively, the carriage module 220 may be provided in a larger number and the gap adjusting unit 300 may be provided to adjust the gap between the carriage modules 220. Hereinafter, exemplary embodiments of the gap adjusting unit 300 will be described in detail with reference to FIGS. 2 to 7.

Exemplary Embodiment 1)

FIG. 2 illustrates the tower lift 200 including a gap adjusting unit 300a according to an exemplary embodiment of the present invention. Referring to FIG. 2, the spacing adjusting unit 300a has a base plate 321 and a driving member.

The base plate 321 is mounted on the driving belt 242. The driving member relatively moves any one of the first carriage module 222 and the second carriage module 224 with respect to the other on the base plate 321. In one example, the driving member includes a driving rail 323 and a first driving device 322 and a second driving device 324. The driving rail 323 is provided on the base plate 321. The first carriage module 222 and the second carriage module 224 are mounted on the driving rail 323. The driving rail 323 is provided in a direction parallel to the driving belt 242. The first driving device 322 moves the first carriage module 222 in the vertical direction on the driving rail 323. The second driving device 324 moves the second carriage module 224 in the vertical direction on the driving rail 323. In one example, the first driving device 322 and the second driving device 324 are each provided as a motor. However, the first driving device 322 and the second driving device 324 are not limited thereto, and may be provided as other driving devices capable of moving the first carriage module 222 and the second carriage module 224 along the rail. In the above-described example, the present invention has been described based on the case where each of the first driving device 322 and the second driving device 324 is provided. However, unlike this, only one of the first driving device 322 and the second driving device 324 may be provided to relatively move either the first carriage module 222 or the second carriage module 224 with respect to the other.

The first carriage module 222 and the second carriage module 224 are coupled to the base plate 321 via the driving rail 323. That is, the first carriage module 222 and the second carriage module 224 are indirectly coupled to the driving belt 242 by the base plate 321 and the driving rail 323. When the driving belt 242 is driven, the base plate 321 moves in the vertical direction by the driving plate. As the base plate 321 moves, the first carriage module 222 and the second carriage module 224 move in the vertical direction at the same time. However, as the first driving device 322 and the second driving device 324 are provided, the first carriage module 222 and the second carriage module 224 may be independently moved on the base plate 321.

Exemplary Embodiment 2)

Figure 3:
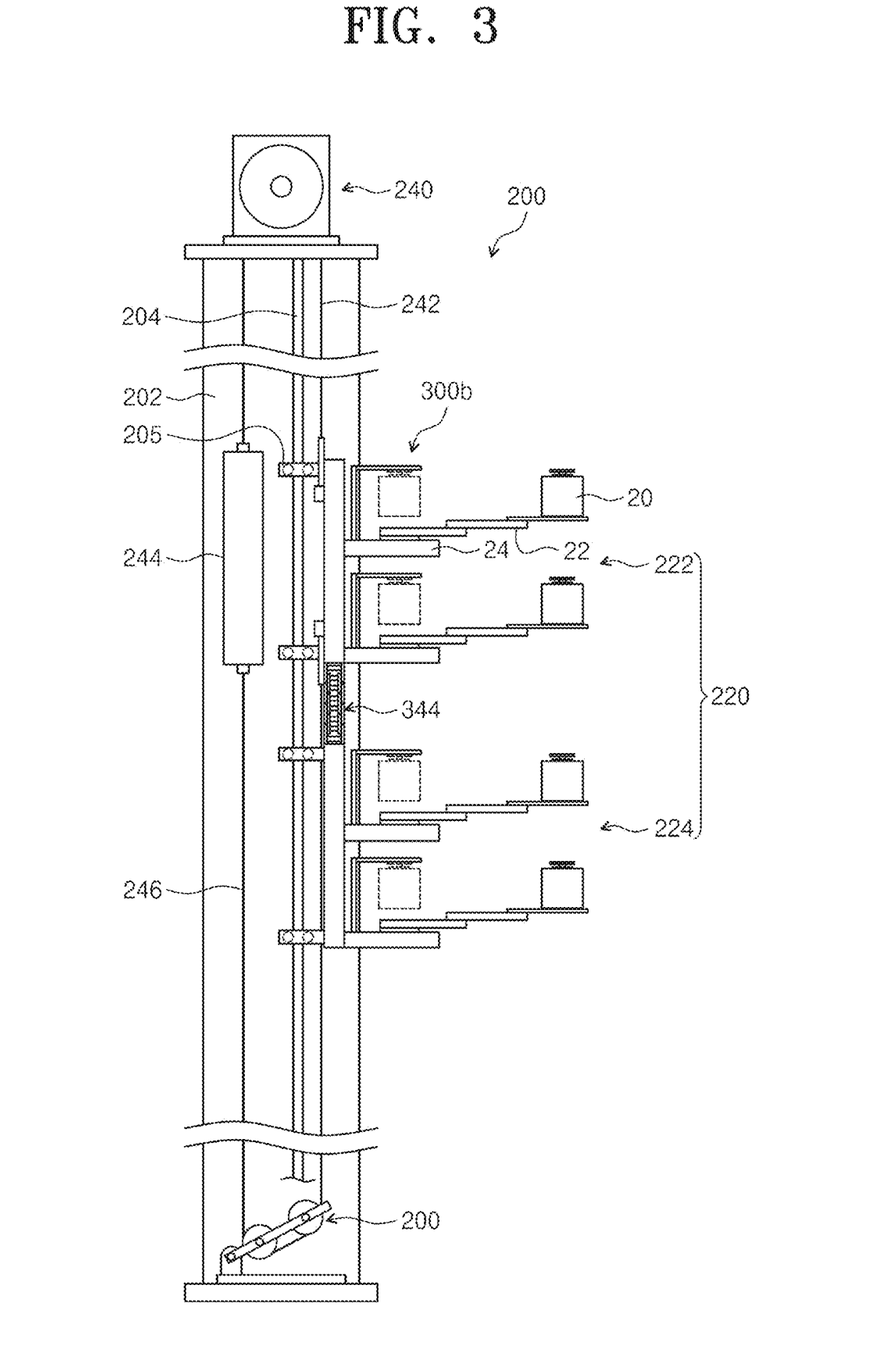
FIG. 3 is a diagram illustrating a tower lift including a gap adjusting unit according to another exemplary embodiment of the present invention.
Figure 4:
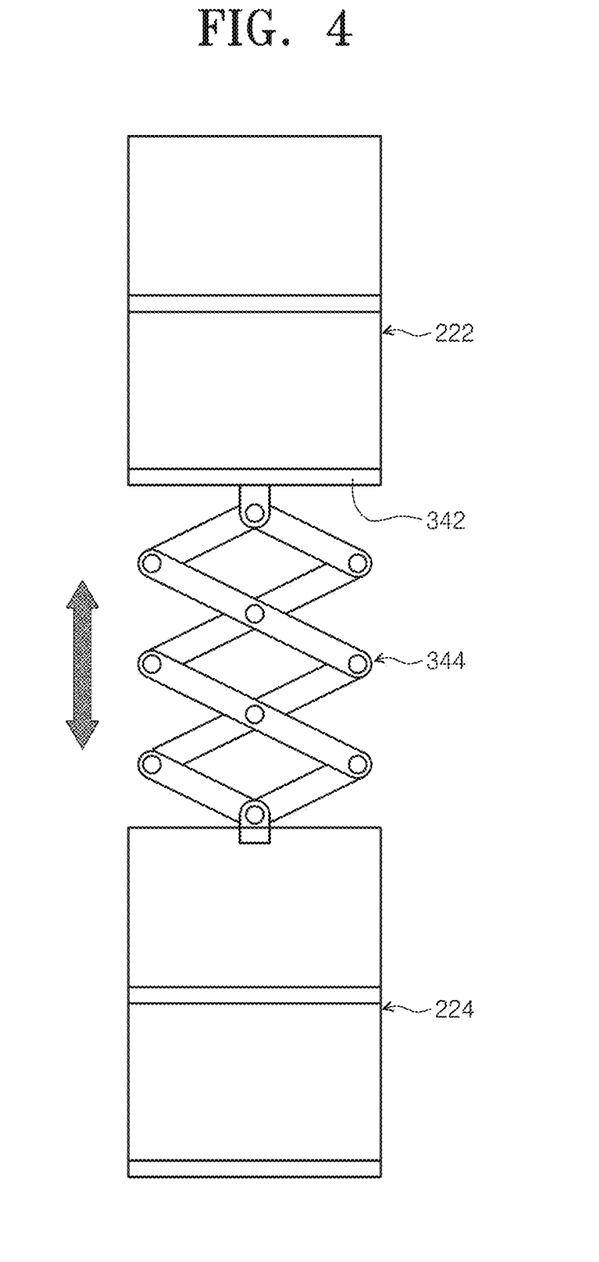
FIGS. 4 and 5 are diagrams illustrating the gap adjusting unit of FIG. 3.
Figure 5:
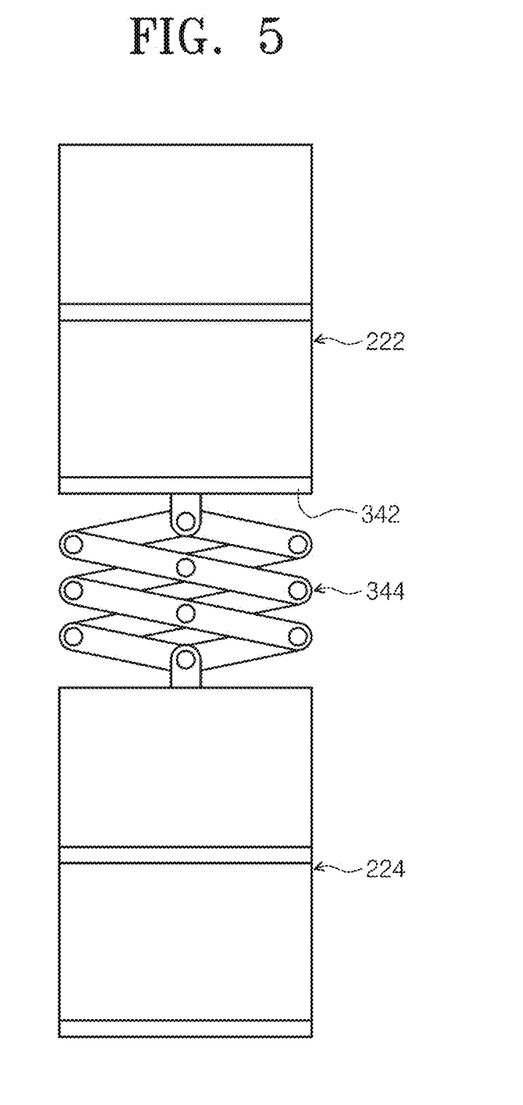

FIG. 3 is a diagram illustrating a tower lift 200 including a gap adjusting unit 300b according to another exemplary embodiment of the present invention, and FIGS. 4 and 5 each illustrate a pentagraph structure 344 of FIG. 3. Referring to FIGS. 3 to 5, the gap adjusting unit 300b includes a pentagraph structure 344.

In Exemplary Embodiment 2, the first carriage module 222 is fixed to the driving belt 242. On the other hand, the second carriage module 224 is not fixed to the driving belt 242, but is indirectly coupled to the driving belt 242 by the pentagraph structure 344 to be described later. The second carriage module 224 is not fixed to the driving belt 242, but is mounted on the guide rail by the guide wheel, so that the second carriage module 244 is provided so as to follow a direction parallel to the body in vertical movement.

The pentagraph structure 344 connects the first carriage module 222 and the second carriage module 224. The pentagraph structure 344 is formed of a plurality of X-shaped links as illustrated in FIGS. 4 to 5. The pentagraph structure 344 is contracted or expanded to relatively move one of the first carriage module 222 and the second carriage module 224 with respect to the other. The pentagraph structure 344 has an actuator 342. The actuator 342 is mounted on the first carriage module 222 or the second carriage module 224. In one example, the actuator 342 is mounted to the first carriage module 222. The actuator 342 relatively moves the second carriage module 224 with respect to the first carriage module 222 as the pantograph structure 344 is expanded as illustrated in FIG. 4 or is contracted as illustrated in FIG. 5.

The first carriage module 222 is fixed to the driving belt 242, and the second carriage module 224 is indirectly coupled to the driving belt 242 via the pentagraph structure 344. When the driving belt 242 is driven, the first carriage module 222 is moved in the vertical direction. In addition, the second carriage module 224 coupled to the first carriage module 222 through the pentagraph structure 344 is moved in the vertical direction together with the first carriage module 222. However, the pantograph structure 344 may adjust the gap between the first carriage module 222 and the second carriage module 224 as the pentagraph structure 233 expands or contracts. Accordingly, the first carriage module 222 and the second carriage module 224 are raised and lowered together by the driving belt 242, but the gap between the first carriage module 222 and the second carriage module 224 may be adjusted in the length range from a length when the pentagraph structure 233 is extended to a maximum length to a length when the pentagraph structure 233 is contracted to a minimum length.

Exemplary Embodiment 3)

Figure 6:
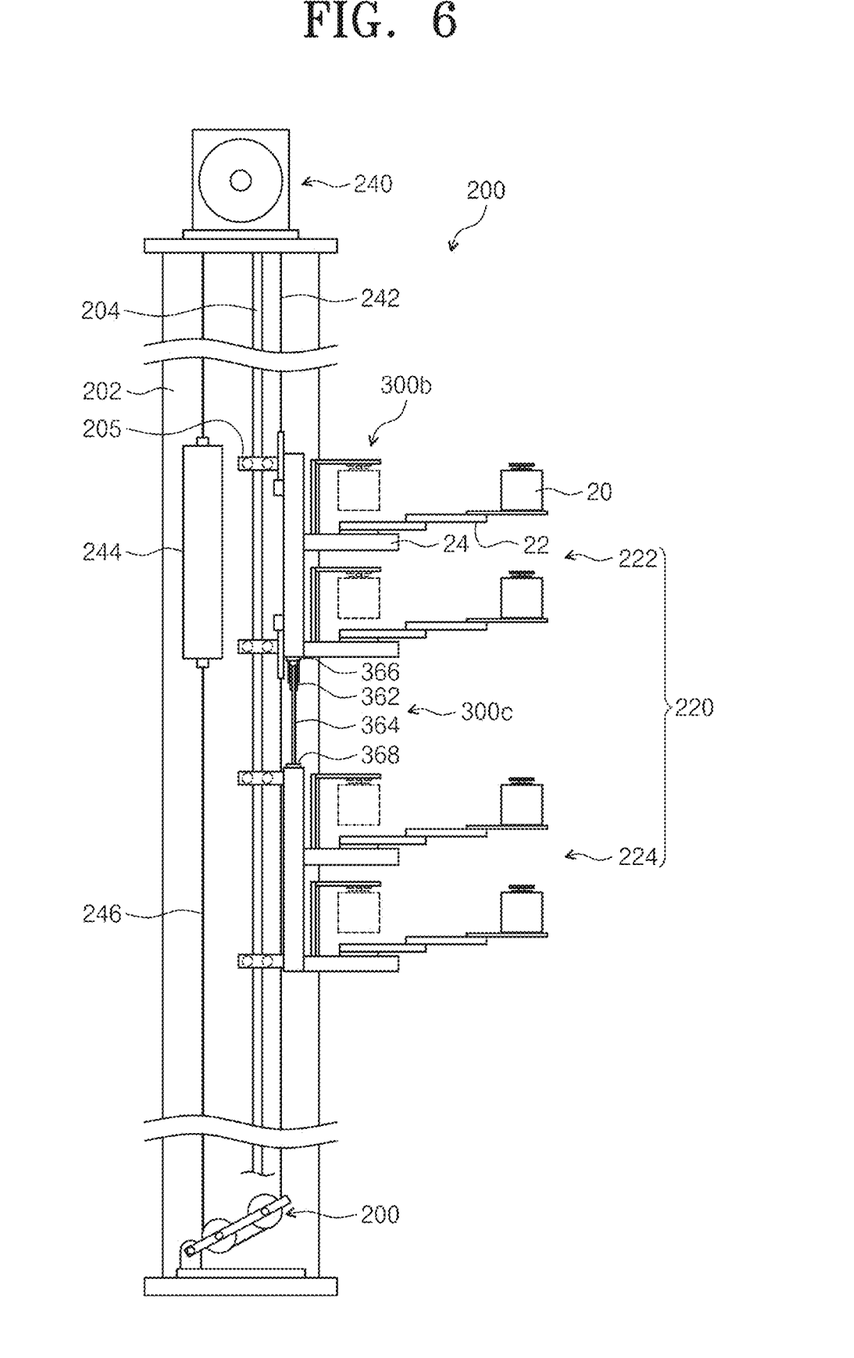
FIG. 6 is a diagram illustrating a tower lift including a gap adjusting unit according to another exemplary embodiment of the present invention.
Figure 7:
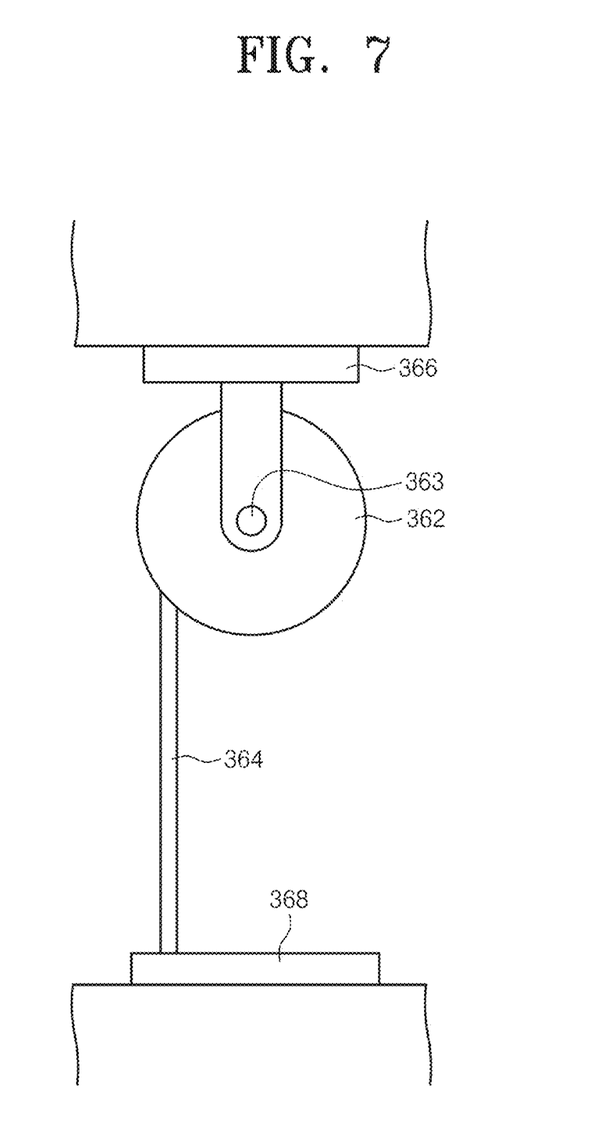
FIG. 7 is a diagram illustrating the gap adjusting unit of FIG. 6.

FIG. 6 is a diagram illustrating a tower lift 200 including a gap adjusting unit 300c according to another exemplary embodiment of the present invention, and FIG. 7 is a diagram illustrating the gap adjusting unit 300c of FIG. 6. Referring to FIGS. 6 to 7, the gap adjusting unit 300c includes a connection part 366, a sub belt 364, a sub pulley 362, and a rotating part 363.

In Exemplary Embodiment 3, the first carriage module 222 is fixed to the driving belt 242. On the other hand, the second carriage module 224 is not fixed to the driving belt 242, but is indirectly coupled to the driving belt 242 by a sub-belt 364 to be described later. The second carriage module 224 is not fixed to the driving belt 242, but is mounted on the guide rail by the guide wheel, so that the second carriage module 244 is provided so as to follow a direction parallel to the body in vertical movement.

The sub belt 364 is mounted on the first carriage module 222 and the second carriage module 224 to connect the first carriage module 222 and the second carriage module 224. The sub belt 364 is mounted on the sub pulley 362, and the rotating part 363 rotates the sub pulley 362 to move the sub belt 364. In one example, the sub pulley 362 is mounted to the first carriage module 222 through the connection part 366. In one example, the sub belt 364 may have one end wound around the sub pulley 362 and the other end coupled to the second carriage module 224 by a coupling part 368. The gap between the first carriage module 222 and the second carriage module 224 is increased according to the one-way rotation of the sub-pulley 362, and the gap between the first carriage module 222 and the second carriage module 224 is decreased in the opposite direction of the sub pulley 362. The sub belt 364 is operated separately from the driving belt 242 by the sub pulley 362 and the rotating part 363.

The first carriage module 222 is fixed to the driving belt 242, and the second carriage module 224 is indirectly coupled to the driving belt 242 via the sub belt 364. When the driving belt 242 is driven, the first carriage module 222 is moved in the vertical direction. Then, the second carriage module 224 coupled to the first carriage module 222 through the sub belt 364 is moved in the vertical direction together with the first carriage module 222. However, since the sub belt 364 is operated separately from the driving belt 242, the gap between the first carriage module 222 and the second carriage module 224 may be adjusted. Accordingly, the first carriage module 222 and the second carriage module 224 are raised and lowered together by the driving belt 242, but the gap between the first carriage module 222 and the second carriage module 224 may be independently adjusted by the sub belt 364.

Hereinafter, a method of transferring an object to be transferred to a semiconductor manufacturing line 800 of the present invention will be described with reference to FIGS. 8 to 12. Hereinafter, the transfer of the object to be transferred to the semiconductor manufacturing line 800 by using the gap adjusting unit 300 of Exemplary Embodiment 1 will be described as an example. However, the object to be transferred may be transferred by using the gap adjusting unit 300 of Exemplary Embodiment 2 or Exemplary Embodiment 3.

Hereinafter, it will be described that the destination to which the object to be transferred is transferred is the semiconductor manufacturing line 800 having a multi-floor structure. However, unlike this, the destination may be provided as another object, such as a plurality of process chambers, rather than the semiconductor manufacturing line.

Figure 8:
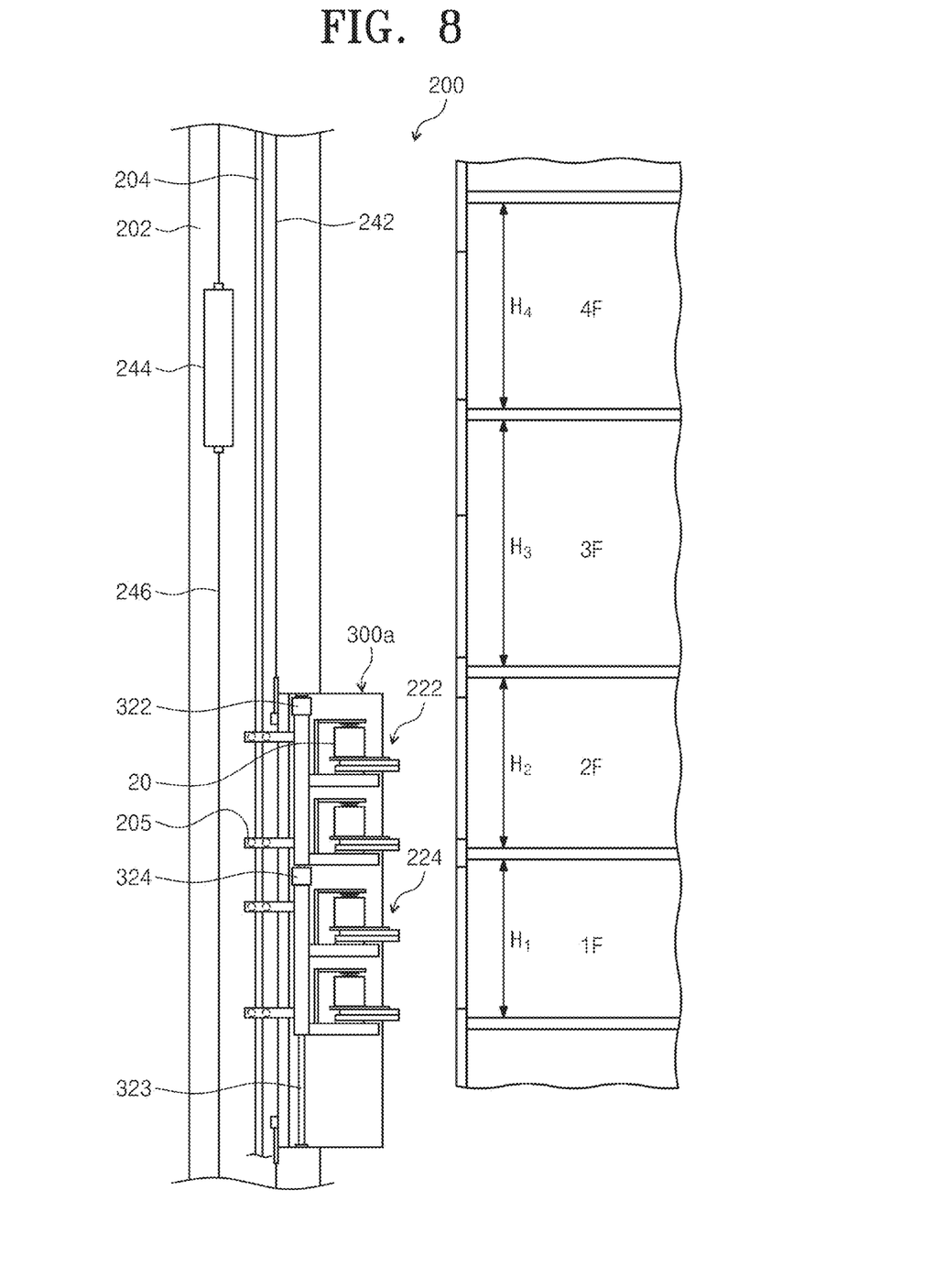
FIGS. 8 to 12 each are diagrams illustrating a state of transferring an object to be transferred to a semiconductor manufacturing line according to an exemplary embodiment of the present invention.

Referring to FIG. 8, the semiconductor manufacturing line 800 may have a multi-floor structure. For example, the semiconductor manufacturing line 800 may have a first floor, a second floor, a third floor, and a fourth floor. However, the present invention is not limited thereto, and the multi-floor structure of the semiconductor manufacturing line 800 may be variously modified. Semiconductor manufacturing apparatuses (not illustrated) for performing the semiconductor manufacturing process may be provided in the semiconductor manufacturing line 800. In one example, the object to be transferred is the container 20 in which a substrate is accommodated, and a stocker for storing an apparatus for treating a substrate or the container 20 for accommodating the substrate may be provided in each of the floors. In one example, the tower lift 200 may transfer the container 20 in which an article is accommodated between the respective floors of the semiconductor manufacturing line 800.

One of the distances between adjacent floors of the semiconductor manufacturing line 800 may be different from the other distance. For example, the height of each floor may be provided differently. When both the first carriage module 222 and the second carriage module 224 are directly coupled to the driving belt 242, the gap between the first carriage module 222 and the second carriage module 224 cannot be adjusted. Accordingly, when the height of each floor is provided differently, during the time when one carriage module 220 transfers the object to be transferred, the other carriage module 220 cannot transfer the object to be transferred. To prevent this, in the present invention, the gap adjusting unit 300 adjusts the gap between the first carriage module 222 and the second carriage module 224.

In one example, the first carriage module 222 transfers the container 20 to each of the fourth floor and the second floor, and the second carriage module 224 transfers the container 20 to each of the third floor and the first floor.

Hereinafter, the present invention will be described based on the case where the first carriage module 222 transfers the container 20 to the fourth floor and the second floor, and the second carriage module 224 transfers the container 20 to the third floor and the first floor. However, the present invention is not limited thereto, and the container 20 may be transferred in various orders in which the first carriage module 222 transfers the container 20 to a floor higher than the second carriage module 224.

Figure 9:
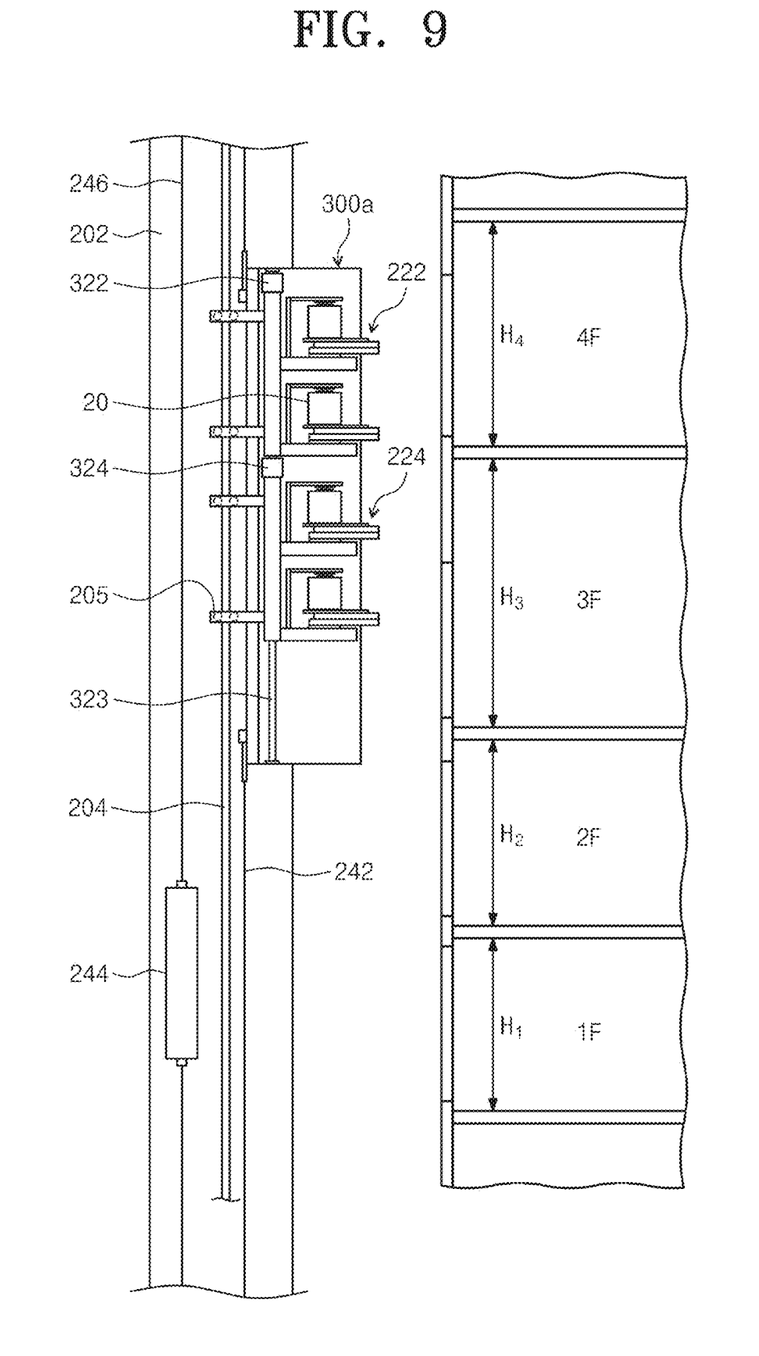
Figure 10:
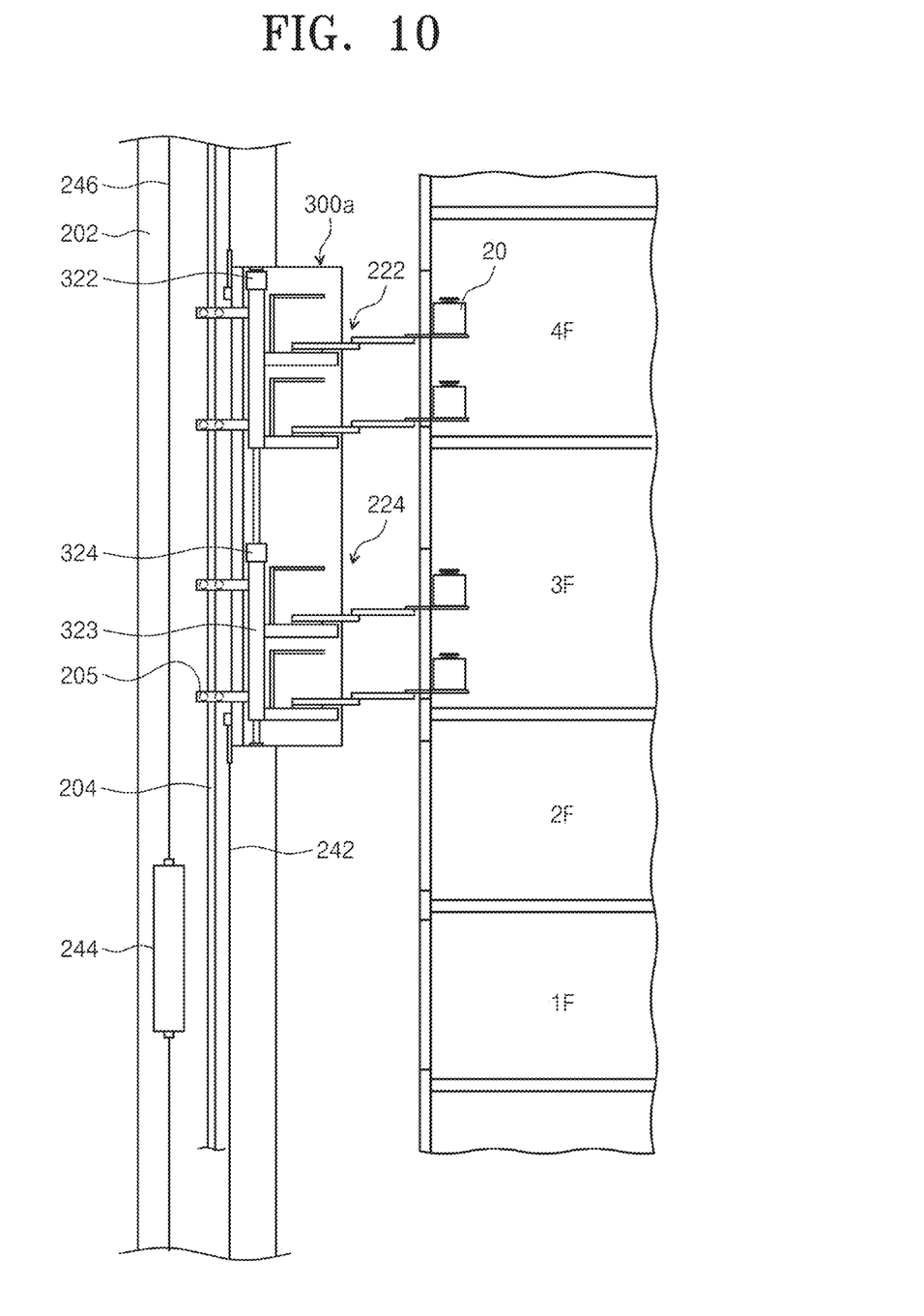

First, as illustrated in FIG. 9, the first carriage module 222 and the second carriage module 224 are simultaneously raised by driving the driving belt 242. When the first carriage module 222 is placed in a position corresponding to the fourth floor or the second carriage module 224 is placed in a position corresponding to the third floor, the driving of the driving belt 242 is stopped. In one example, the present invention will be described based on the case where when the first carriage module 222 is placed in a position corresponding to the fourth floor, the driving of the driving belt 242 is stopped. Thereafter, the second carriage module 224 is moved to a position corresponding to the third floor by the second driving device provided in the gap adjusting module. Accordingly, as illustrated in FIG. 10, the second carriage module 224 may transfer the container 20 to the third floor while the first carriage module 222 transfers the container 20 to the fourth floor.

Optionally, when the second carriage module 224 is placed in a position corresponding to the third floor, the driving of the driving belt 242 is stopped. Thereafter, the first carriage module 222 may be moved to a position corresponding to the fourth floor by the first driving device provided in the gap adjusting module. Alternatively, after the base plate 321 is moved to a position adjacent to the third and fourth floors, the first carriage module 222 may be moved to a position corresponding to the fourth floor by the first driving device, and the second carriage module 224 may be moved to a position corresponding to the third floor by the second driving device.

Figure 11:
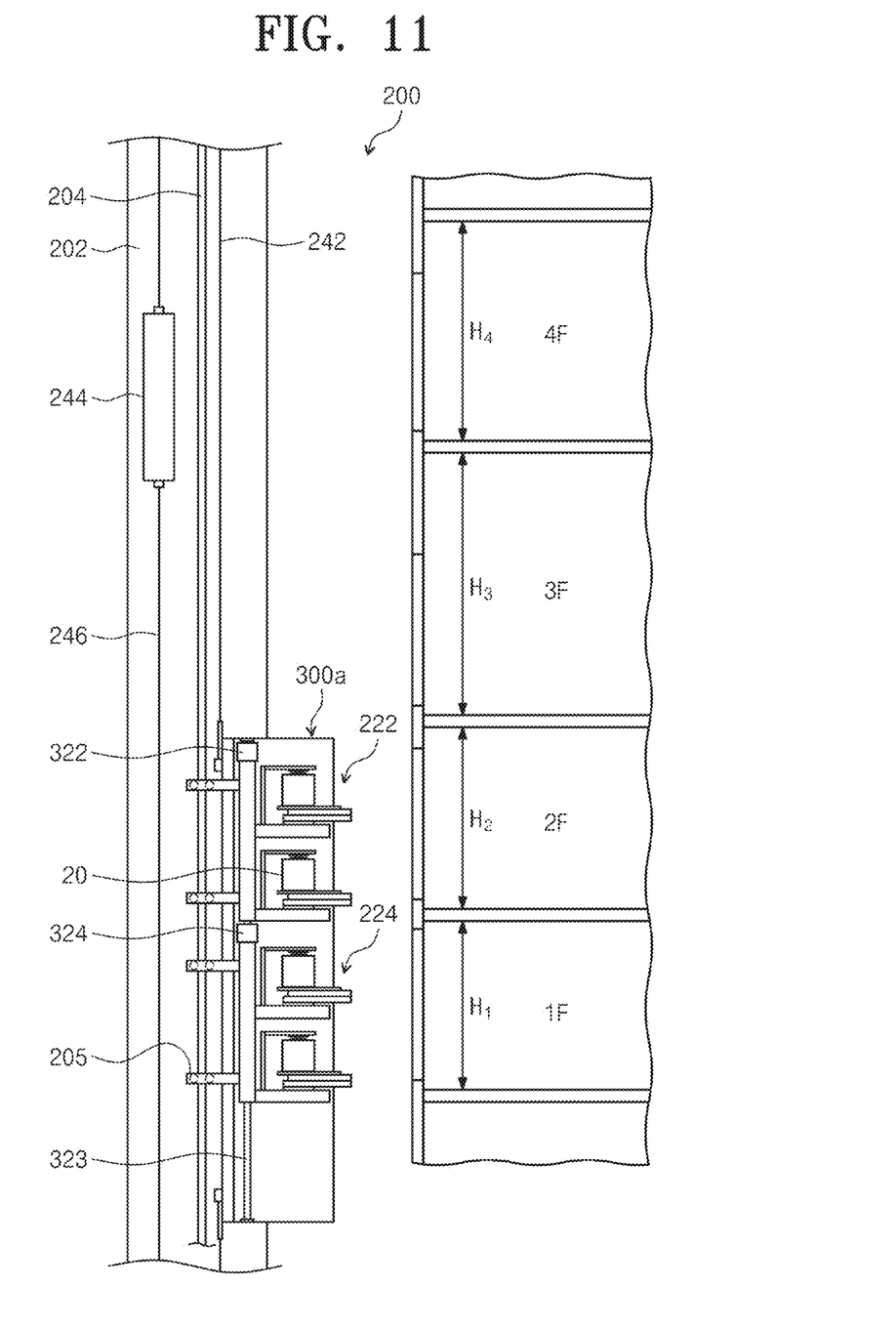
Figure 12:
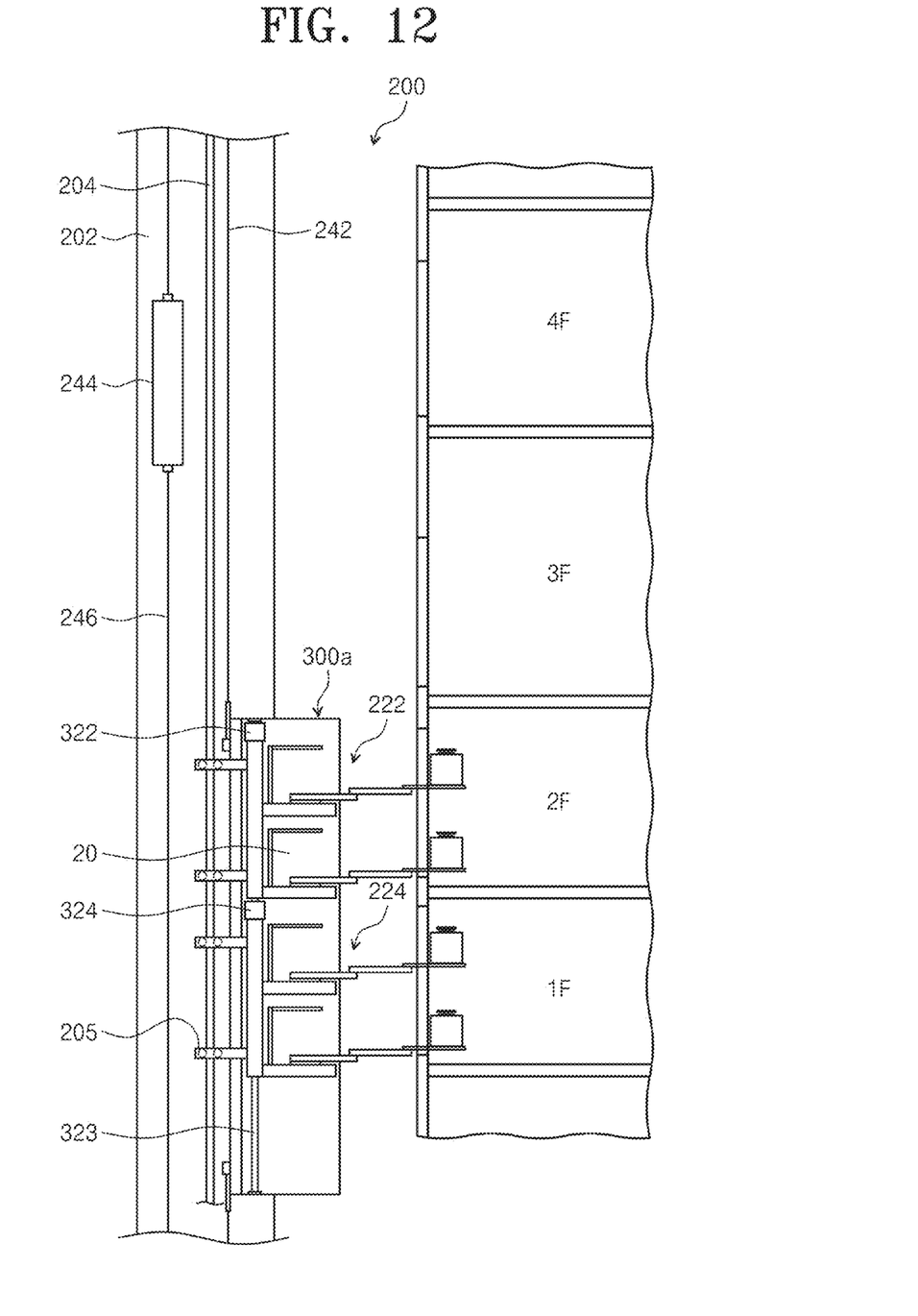

Then, the first carriage module 222 transfers the container 20 to the second floor, and the second carriage module 224 transfers the container 20 to the first floor. Referring to FIG. 11, the first carriage module 222 and the second carriage module 224 are simultaneously lowered by driving the driving belt 242. When the first carriage module 222 is placed in a position corresponding to the second floor or the second carriage module 224 is placed in a position corresponding to the first floor, the driving of the driving belt 242 is stopped. In one example, the present invention is described based on the case where when the first carriage module 222 is placed in a position corresponding to the second floor, the driving of the driving belt 242 is stopped. Thereafter, the second carriage module 224 is moved to a position corresponding to the first floor by the second driving device provided in the gap adjusting module. Accordingly, as illustrated in FIG. 12, the second carriage module 224 may transfer the container 20 to the first floor while the first carriage module 222 transfers the container 20 to the second floor.

Optionally, when the second carriage module 224 is placed in a position corresponding to the third floor, the driving of the driving belt 242 is stopped. Thereafter, the first carriage module 222 may be moved to a position corresponding to the fourth floor by the first driving device provided in the gap adjusting module. Alternatively, after the base plate 321 is moved to a position adjacent to the third and fourth floors, the first carriage module 222 may be moved to a position corresponding to the fourth floor by the first driving device, and the second carriage module 224 may be moved to a position corresponding to the third floor by the second driving device.

In the example described above, the present invention has been described based on the case where the first carriage module 222 and the second carriage module 224 transfer the container 20 to the third and fourth floors, and then transfer the container 20 to the first and second floors. However, unlike this, the first carriage module 222 and the second carriage module 224 may transfer the container 20 to the first and second floors and then transfer the container 20 to the third and fourth floors.

In the above example, the present invention has been described based on the case where the first carriage module 222 and the second carriage module 224 transfer the container the container 20 to the adjacent floors. However, unlike this, the second carriage module 224 may transfer the container 20 to the first or second floor while the first carriage module 222 transfers the container 20 to the fourth floor. Alternatively, the second carriage module 224 may transfer the container 20 to the first floor while the first carriage module 222 transfers the container 20 to the third floor.

According to the present invention, since the gap between the first carriage module 222 and the second carriage module 224 is adjusted, there is an advantage in that it is possible to increase the amount of objects transferred.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The technical protection scope of the present invention should be determined by the technical spirit of the claims, and it should be understood that the technical protection scope of the present invention is not limited to the literal description of the claims itself, but is substantially equivalent to the technical value.

What is claimed is:

1. A tower lift, comprising:
   a body;
   a first carriage module and a second carriage module configured to be movable in a vertical direction along the body and each are configured to support a container to be transferred;
   a driving unit comprising a driving belt configured to vertically move the first carriage module and the second carriage module and on which the first carriage module or the second carriage module is mounted; and
   a gap adjusting unit configured to adjust a gap between the first carriage module and the second carriage module,
   wherein the gap adjusting unit includes
      a base plate mounted on the driving belt,
      a driving member configured to relatively move one of the first carriage module or the second carriage module with respect to an other of the first carriage module or the second carriage module, wherein a relative movement of the first carriage module or the second carriage module with respect to each other occurs on the base plate, and
      a driving rail on the base plate and upon which the first carriage module and the second carriage module are mounted, and the driving member includes
         a first driving device configured to move the first carriage module on the driving rail, and
         a second driving device configured to move the second carriage module on the driving rail,
   wherein the first driving device includes a first motor configured to move the first carriage module along the driving rail, and the second driving device includes a second motor configured to move the second carriage module along the driving rail,
   wherein the first motor and the second motor are configured to operate independently of each other to move the first carriage module and the second carriage module, respectively,
   wherein the first motor is configured to move the first carriage module independently of the second carriage module relative to the base plate, and
   wherein the second motor is configured to move the second carriage module independently of the second carriage module relative to the base plate.

2. The tower lift of claim 1, wherein the driving unit further includes:
   a main pulley above the body and coupled to the driving belt; and
   a rotating device configured to rotate the main pulley.

3. The tower lift of claim 1, further comprising:
   a guide rail configured to guide a vertical movement of the first carriage module and the second carriage module, and
   the first carriage module and the second carriage module are provided with a guide wheel in contact with the guide rail.

4. The tower lift of claim 1, wherein the container is configured to accommodate a substrate.

5. A logistics system, comprising:
   a tower lift configured to transfer a container in which a substrate is stored to one or more destinations,
   wherein the tower lift includes:
   a body;
   a first carriage module and a second carriage module configured to be movable in a vertical direction along the body by a driving belt; and
   a gap adjusting unit configured to adjust a gap between the first carriage module and the second carriage module, and
   the gap between the first carriage module and the second carriage module is provided to be changeable by the gap adjusting unit,
   wherein the gap adjusting unit includes
      a base plate mounted on the driving belt,
      a driving member configured to relatively move one of the first carriage module or the second carriage module with respect to an other of the first carriage module or the second carriage module, wherein a relative movement of the first carriage module or the second carriage module with respect to each other occurs on the base plate, and
      a driving rail on the base plate and upon which the first carriage module and the second carriage module are mounted, and
   the driving member includes
      a first driving device configured to move the first carriage module on the driving rail, and
      a second driving device configured to move the second carriage module on the driving rail,
   wherein the first driving device includes a first motor configured to move the first carriage module along the driving rail, and the second driving device includes a second motor configured to move the second carriage module along the driving rail,
   wherein the first motor and the second motor are configured to operate independently of each other to move the first carriage module and the second carriage module, respectively,
   wherein the first motor is configured to move the first carriage module independently of the second carriage module relative to the base plate, and wherein the second motor is configured to move the second carriage module independently of the second carriage module relative to the base plate.

6. The logistics system of claim 5, further comprising:
a main pulley above the body and coupled to the driving belt; and
a rotating device configured to rotate the main pulley.

7. The logistics system of claim 5, further comprising:
a guide rail configured to guide a vertical movement of the first carriage module and the second carriage module, and
wherein the first carriage module and the second carriage module are provided with a guide wheel in contact with the guide rail.

8. The logistics system of claim 5, wherein the first carriage module and the second carriage module each further include:
a support configured to support the container for storing the substrate therein; and
a moving device configured to extend the support in a direction in which a destination of the one or more destinations is provided or to contract the support in an opposite direction.

* * * * *